US006707318B2

(12) United States Patent
Kumar et al.

(10) Patent No.: US 6,707,318 B2
(45) Date of Patent: Mar. 16, 2004

(54) LOW POWER ENTRY LATCH TO INTERFACE STATIC LOGIC WITH DYNAMIC LOGIC

(75) Inventors: Sudarshan Kumar, Fremont, CA (US); Shahram Jamshidi, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/107,740

(22) Filed: Mar. 26, 2002

(65) Prior Publication Data

US 2003/0184344 A1 Oct. 2, 2003

(51) Int. Cl.[7] .............................................. H03K 19/096
(52) U.S. Cl. .......................................... 326/98; 326/95
(58) Field of Search ................................ 326/95, 1, 98, 326/112, 119, 121

(56) References Cited

U.S. PATENT DOCUMENTS 6,255,854 B1 * 7/2001 Houston ........................ 326/98
6,404,235 B1 * 6/2002 Nowka et al. ................ 326/96

\* cited by examiner

*Primary Examiner*—Anh Tran
(74) *Attorney, Agent, or Firm*—Seth Z. Kalson

(57) ABSTRACT

An entry latch to provide a dynamic signal at an output port in response to input static signals at a pulldown network, the pulldown network to conditionally discharge an internal node depending upon the input static signals, the entry latch comprising a pass transistor having a first source/drain connected to the output port and a second source/drain connected to a gate of a pullup pMOSFET, where the pullup pMOSFET turns ON only if the pulldown network does not turn ON during the evaluation phase.

15 Claims, 4 Drawing Sheets

LOW POWER ENTRY LATCH TO INTERFACE STATIC LOGIC WITH DYNAMIC LOGIC

FIELD

Embodiments of the present invention relate to digital circuits, and more particularly, to an entry latch for interfacing static logic with dynamic logic.

BACKGROUND

Dynamic (or domino) logic circuits are often employed in high performance systems. For example, consider a computer system, such as that illustrated in FIG. 1. In FIG. 1, microprocessor 102 comprises many sub-blocks, such as arithmetic logic unit (ALU) 104 and on-chip cache 106. Microprocessor 102 may also communicate to other levels of cache, such as off-chip cache 108. Higher memory hierarchy levels, such as volatile system memory 110, are accessed via host bus 112 and chipset 114. In addition, other off-chip functional units, such as graphics accelerator 116 and network interface controller (NIC) 118, to name just a few, may communicate with microprocessor 102 via appropriate busses or ports.

Some or all of the functional units making up a computer system as described above may comprise dynamic logic circuits. Entry latches are used to interface static logic with dynamic logic. A prior art entry latch at the circuit level is shown in FIG. 2. The clock signal is represented by $\phi$. Static input signals are provided at input ports 202 (there may be one or more input ports), which are connected to static logic (not shown). A dynamic output signal is provided at output port 204, which is connected to dynamic logic (not shown). nMOS pulldown network 218 comprises one or more nMOSFETs to perform a logical function on the static input signals, where input ports 202 are connected to various nMOSFET gates within nMOS pulldown network 218. The dynamic output signal is LOW during the pre-charge phase when clock signal $\phi$ is LOW, and the dynamic output signal is either LOW or HIGH during the evaluation phase when clock signal $\phi$ is HIGH, depending upon the logical function performed by nMOS pulldown network 218.

The behavioral operation of the entry latch in FIG. 2 is fairly straightforward, and accordingly only a brief description is provided. Keeper 210 comprises inverter 212, pullup pMOSFET 214, and pulldown nMOSFET 216. When clock signal $\phi$ is LOW during a pre-charge phase: pullup pMOSFET 206 is ON so that node 208 is HIGH; inverter 212 provides a LOW dynamic output signal at output port 204 so that pulldown nMOSFET 216 is OFF; and pullup pMOSFET 214 is ON. Static input signals at input ports 202 are setup before the rise of clock signal $\phi$. At the beginning of an evaluation phase when clock signal $\phi$ transitions from LOW to HIGH: pullup pMOSFET 206 switches OFF; nMOSFET 220 switches ON; but nMOSFET 222 will still be ON because of the signal delay introduced by inverter 224. With both nMOSFETs 220 and 222 ON at the beginning of an evaluation phase, a conditional low impedance path will be provided between node 208 and ground, depending upon the static input signals and logical function performed by nMOS pulldown network 218. If a low impedance path is provided between node 208 and ground, then nMOSFET 216 will switch ON and pMOSFET 214 will switch OFF, and node 208 is held LOW. But if no low impedance path is provided between node 208 and ground, then pMOSFET 214 will continue to stay ON and node 208 would be kept HIGH. After a signal delay introduced by inverter 224, nMOSFET 222 will switch OFF. In this way, a dynamic logic signal is latched at node 208, and consequently also at output port 204.

It is to be noted from the above description that at the beginning of an evaluation phase in which a low impedance path is provided between node 208 and ground, there is contention between nMOS pulldown network 218 and pullup pMOSFET 214. This contention contributes to gate delay and dynamic power consumption. Reducing the size of pullup pMOSFET 214 may reduce this inherent gate delay and dynamic power consumption, but at the expense of increasing the noise margin and soft error rate, which may be an unacceptable tradeoff. Consequently, there is utility in an entry latch with reduced gate delay and dynamic power consumption without the drawback of increased noise margin and soft error rate.

DESCRIPTION OF EMBODIMENTS

Figure 3:
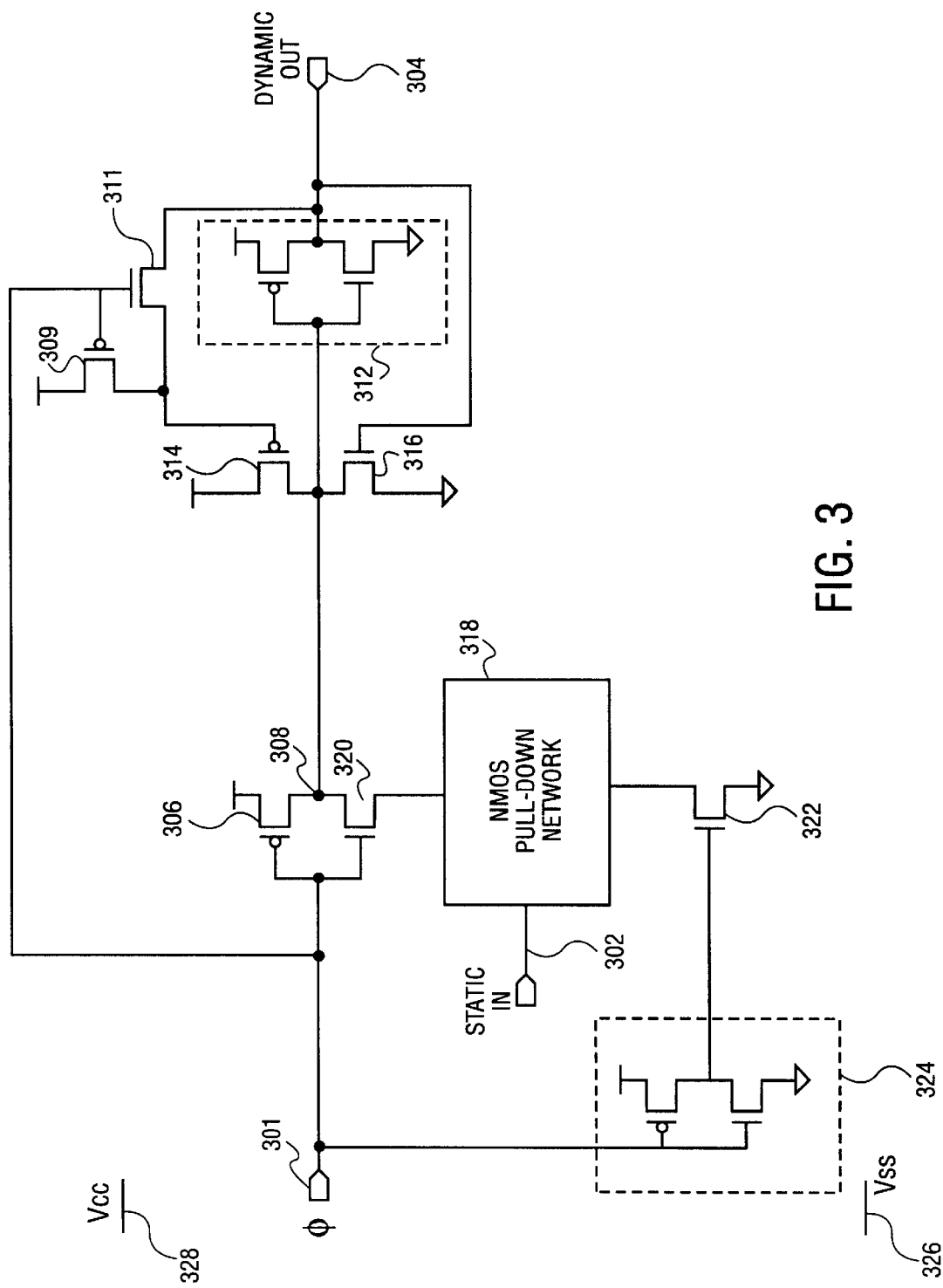
FIG. 3 is an embodiment at the circuit level according to the present invention.

An embodiment entry latch according to the present invention at the circuit level is shown in FIG. 3. The clock signal is represented by $\phi$, and is provided at clock port 301. Static input signals are provided at input ports 302 (there may be one or more input ports), which are connected to static logic (not shown). A dynamic output signal is provided at output port 304, which is connected to dynamic logic (not shown). nMOS pulldown network 318 comprises one or more nMOSFETs to perform a logical function on the static input signals, where input ports 302 are connected to various nMOSFET gates within nMOS pulldown network 318. The dynamic output signal is LOW during the pre-charge phase when clock signal $\phi$ is LOW, and the dynamic output signal is either LOW or HIGH during the evaluation phase when clock signal $\phi$ is HIGH, depending upon the logical function performed by nMOS pulldown network 318.

When clock signal $\phi$ is LOW during a pre-charge phase: pullup pMOSFET 306 is ON to provide a low impedance path between node 308 and power rail 328 so that node 308 is HIGH; pullup pMOSFET 309 is ON and pass nMOSFET 311 is OFF so that pullup pMOSFET 314 is OFF; and inverter 312 provides a LOW dynamic output signal at output port 304 so that nMOSFET 316 is also OFF. Static input signals at input ports 302 are setup before the rise of clock signal $\phi$. At the beginning of an evaluation phase when clock signal $\phi$ transitions from LOW to HIGH: pass nMOSFET 311 switches ON; pullup pMOSFET 309 switches OFF; pullup pMOSFET 306 switches OFF; nMOSFET 320 switches ON; but nMOSFET 322 will still be ON because of the signal delay introduced by inverter 324. With both nMOSFETs 320 and 322 ON at the beginning of an evaluation phase, a conditional low impedance path will be provided between node 308 and ground (or substrate) 326, depending upon the static input signals and logical function performed by nMOS pulldown network 318. If a low impedance path is provided between node 308 and ground 326, then nMOSFET 316 will switch ON so that node 308 is held LOW.

However, if nMOS pulldown network 318 does not provide a low impedance path between node 308 and ground 326 when clock signal φ transitions from LOW to HIGH, then after a signal delay introduced by inverter 312 and pass nMOSFET 311, pMOSFET 314 will switch ON to provide a low impedance path between node 308 and power rail 328 so that node 308 is kept HIGH. Also, after a signal delay introduced by inverter 324, nMOSFET 322 will switch OFF. In this way, a dynamic logic signal is latched at node 308, and consequently, also at output port 304.

Note that pMOSFET 314 is OFF when clock signal φ transitions from LOW to HIGH, and pMOSFET 314 does not switch ON before the signal delay introduced by inverter 312 and pass nMOSFET 311. Consequently, when the static input signals and nMOS pulldown network 318 are such that a low impedance path is provided between node 308 and ground 326 at the beginning of an evaluation phase, there is no contention between nMOS pulldown network 318 and pullup pMOSFET 314. In this way, the embodiment of FIG. 3 is expected to have several advantages over the prior art entry latch of FIG. 2.

Figure 1:
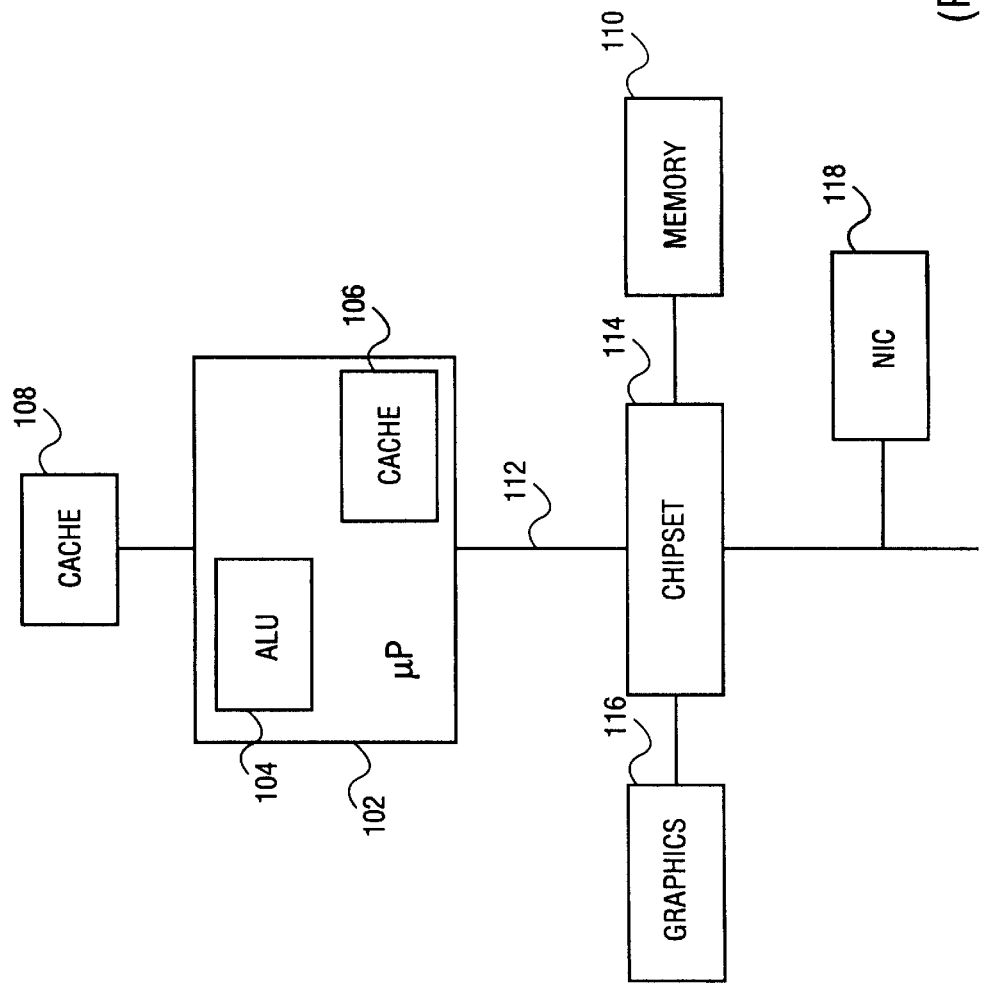
FIG. 1 illustrates a computer system at a high functional level.
Figure 2:
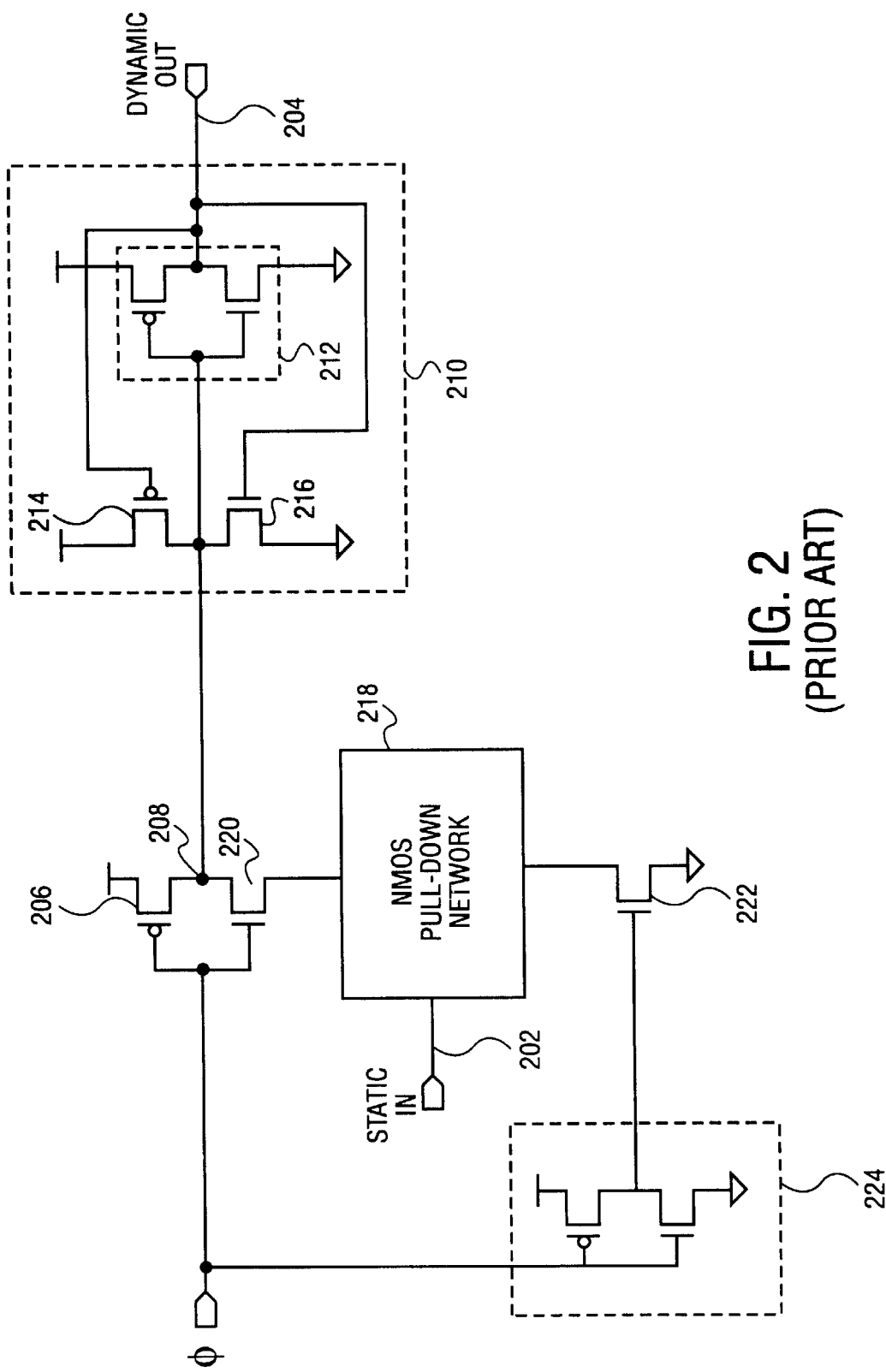
FIG. 2 is a prior art entry latch at the circuit level.

For example, for the same technology and device size, the entry latch of FIG. 3 consumes less dynamic power than that of FIG. 2 because there is no contention with pullup 314. Furthermore, the device sizes for the nMOSFETs making up nMOS pulldown 318 may be made smaller without appreciably increasing the noise margin, so that dynamic power consumption is further reduced and sub-threshold leakage current is also reduced. Also, because there is no contention, pullup 314 may be made larger to better handle burn-in testing. Furthermore, with a larger pullup 314, soft error rate is expected to be improved.

Figure 4:
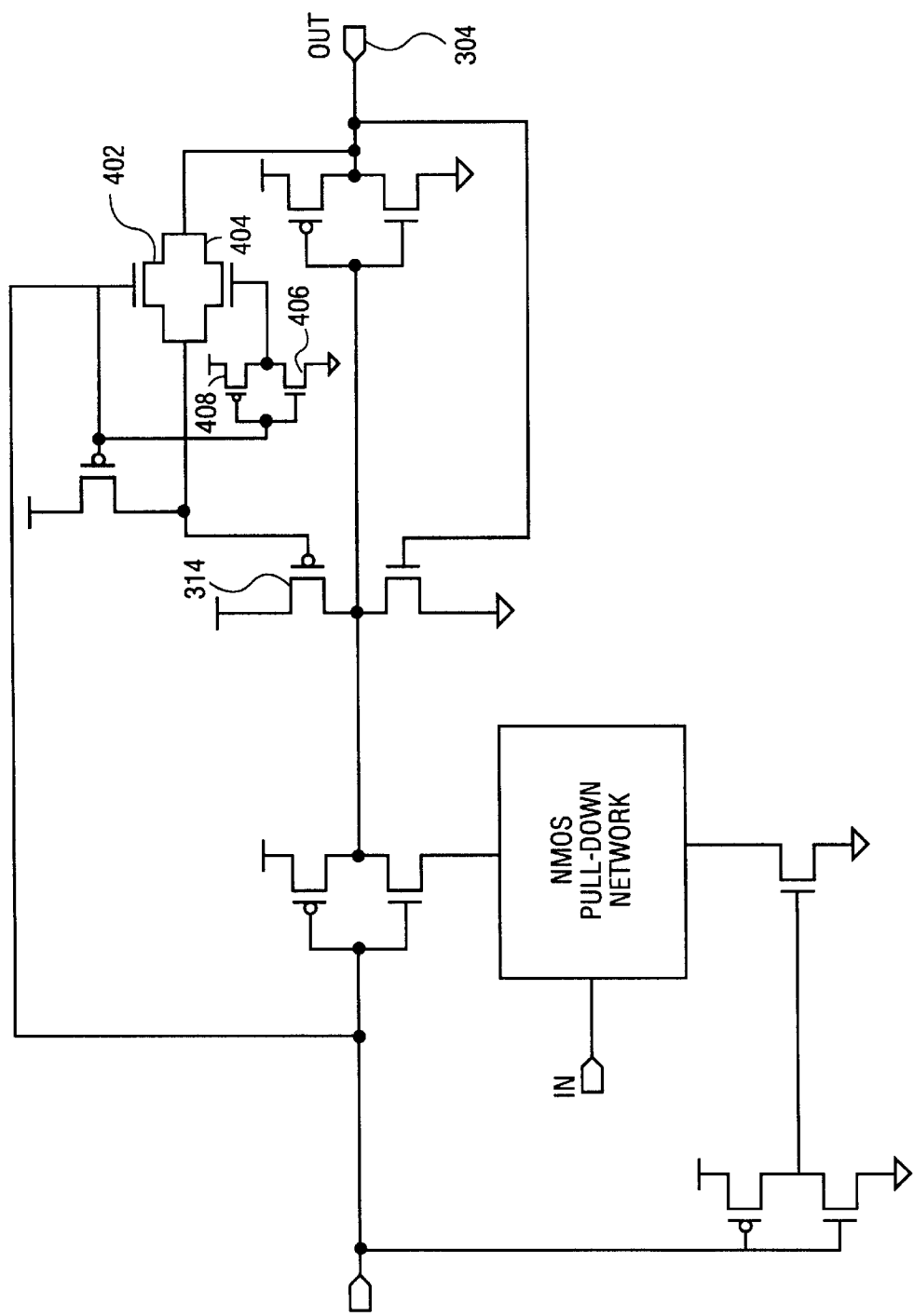
FIG. 4 is another embodiment at the circuit level according to the present invention.

Many variations may be made to the described embodiment without departing from the scope of the invention as claimed below. For example, for some pMOSFETs, it may be possible to substitute a nMOSFET with an inverter in the signal path to its gate. Similarly, for some nMOSFETs, it may be possible to substitute a pMOSFET with an inverter in the signal path to its gate. However, such substitutions may increase signal delay. For a more specific example, referring to FIG. 3, a pass pMOSFET may be used in place of pass nMOSFET 311, where its source/drain terminals are connected as shown for nMOSFET 311, but where an inverter is employed between clock port 301 and the gate of the pass pMOSFET. As another example, it may be possible to substitute a transmission gate for pass nMOSFET 311. For example, in FIG. 4, a transmission gate comprising nMOSFET 402 and pMOSFET 404 couples output port 304 to the gate of pMOSFET 314. Note that an inverter comprising nMOSFET 406 and pMOSFET 408 is used so that the gate voltage of pMOSFET 404 is the Boolean complement of the gate voltage of nMOSFET 402. It is to be understood in the claims below that a pass transistor may be a pass nMOSFET or a pass pMOSFET, and furthermore, that such a pass transistor may be part of a transmission gate.

What is claimed is:

1. A latch comprising:
   a ground rail;
   a power rail;
   a node;
   an output port;
   an inverter coupled to the node to provide at the output port a HIGH voltage if the node is LOW and a LOW voltage if the node is HIGH;
   a first pullup transistor to provide a low impedance path between the node and the power rail during a precharge phase;
   a pulldown network to conditionally provide a low impedance path between the node and the ground rail for a portion of time during an evaluation phase;
   a second pullup transistor to provide a low impedance path between the node and the power rail only if ON; and
   a pass transistor coupling the output port to the second pullup transistor to switch the second pullup transistor ON only during an evaluation phase and only if the output port voltage is LOW.

2. The latch as set forth in claim 1, further comprising:
   a third pullup transistor coupled to the logic gate to switch the second pullup transistor OFF during a precharge phase.

3. The latch as set forth in claim 2,
   wherein the inverter has an input port connected to the node and an output port connected to the latch output port;
   wherein the pass transistor has a first source/drain connected to the output node and a second source/drain; and
   wherein the second pullup transistor is a pMOSFET having a gate connected to the second source/drain of the nMOSFET and a drain connected to the node.

4. A latch comprising:
   a node;
   an output port;
   a ground rail;
   a clock port;
   a pulldown network to conditionally provide a low impedance path between the node and the ground rail during a portion of time for which the clock port is held HIGH;
   a first pullup pMOSFET having a gate connected to the clock port, and a drain connected to the node;
   an inverter having an input port connected to the node and an output port connected to the output port;
   a pass transistor having a gate coupled to the clock port, a first source/drain connected to the output node, and a second source/drain;
   a second pullup pMOSFET having a gate connected to the second source/drain of the pass transistor, and having a drain connected to the node; and
   a third pullup pMOSFET having a gate connected to the clock port, and a drain connected to the gate of the second pullup pMOSFET.

5. The latch as set forth in claim 4, further comprising:
   a power rail;
   wherein the first, second, and third pullup pMOSFETs have sources connected to the power rail.

6. The latch as set forth in claim 5, wherein the pass transistor is a nMOSFET having a gate connected to the clock port.

7. The latch as set forth in claim 4, wherein the pass transistor is a nMOSFET having a gate connected to the clock port.

8. A latch to provide a dynamic signal at an output port in response to at least one static signal at least one input port, the latch comprising:
   a node;
   a clock port;
   a first pullup pMOSFET having a gate connected to the clock port, and a drain connected to the node;
   a first nMOSFET having a gate connected to the clock port, a drain connected to the node, and a source;

a pulldown network coupled to the at least one input port and to the first nMOSFET;

a second nMOSFET having a drain connected to the pulldown network, and a gate;

a first inverter having an input port connected to the clock port and an output port connected to the gate of the second nMOSFET;

a second inverter having an input port connected to the node, and an output port connected to the output port of the latch;

a second pullup pMOSFET having a drain connected to the node, and a gate; and a pass transistor having a first source/drain connected to the output port, a second source/drain connected to the gate of the second pullup pMOSFET, and a gate coupled to the clock port.

9. The latch as set forth in claim 8, wherein the pass transistor is a nMOSFET having its gate connected to the clock port.

10. The latch as set forth in claim 9, further comprising:

a third pullup pMOSFET having a drain connected to the gate of the second pullup pMOSFET and a gate connected to the gate of the pass transistor.

11. The latch as set forth in claim 8, further comprising:

a third pullup pMOSFET having a drain connected to the gate of the second pullup pMOSFET and a gate coupled to the gate of the pass transistor.

12. A computer system comprising:

a microprocessor; and a volatile memory connected to the microprocessor;

wherein the microprocessor comprises:

a ground rail;

a power rail;

a node;

an output port;

an inverter coupled to the node to provide at the output port a HIGH voltage if the node is LOW and a LOW voltage if the node is HIGH;

first pullup transistor to provide a low impedance path between the node and the power rail during a precharge phase;

a pulldown network to conditionally provide a low impedance path between the node and the ground rail for a portion of time during an evaluation phase;

a second pullup transistor to provide a low impedance path between the node and the power rail only if ON; and a pass transistor coupling the output port to the second pullup transistor to switch the second pullup transistor ON only during an evaluation phase and only if the output port voltage is LOW.

13. An entry latch to provide a dynamic signal in response to at least one input static signal, the entry latch comprising:

a node;

an output port to provide the dynamic signal;

a pulldown network having at least one input port to receive the at least one input static signal, the pulldown network to conditionally discharge the node depending upon the at least one input static signal;

a first pullup pMOSFET having a gate, and a drain connected to the node; and a pass transistor having a gate, a first source/drain connected to the output port, and a second source/drain connected to a gate of the first pullup pMOSFET, wherein the first pullup pMOSFET turns ON only during an evaluation phase and only if the pulldown network does not turn ON.

14. The entry latch as set forth in claim 13, further comprising:

a second pullup pMOSFET having a drain connected to the gate of the first pullup pMOSFET, and a gate coupled to the gate of the pass transistor.

15. The entry latch as set forth in claim 14, wherein the pass transistor is a nMOSFET and the gate of the second pullup pMOSFET is connected to the gate of the pass nMOSFET.

\* \* \* \* \*